United States Patent [19]

Schairer

[11] Patent Number: 4,942,439
[45] Date of Patent: Jul. 17, 1990

[54] LIGHT-EMITTING DIODE OF GaAsP COMPOUND SEMICONDUCTIVE MATERIAL

[75] Inventor: Werner Schairer, Weinsberg, Fed. Rep. of Germany

[73] Assignee: Telefunken electronic GmbH, Heilbronn, Fed. Rep. of Germany

[21] Appl. No.: 213,181

[22] Filed: Jun. 29, 1988

[30] Foreign Application Priority Data

Jul. 1, 1987 [DE] Fed. Rep. of Germany ....... 3721761

[51] Int. Cl.$^5$ ............................................ H01L 33/00
[52] U.S. Cl. ......................................... 357/17; 357/16; 357/90; 357/61
[58] Field of Search .......................... 357/17, 16, 90, 61

[56] References Cited

U.S. PATENT DOCUMENTS

| | | | |
|---|---|---|---|
| 4,037,241 | 7/1977 | Dierschke | 357/17 |
| 4,510,515 | 4/1985 | Kajita et al. | 357/17 |
| 4,680,602 | 7/1987 | Watanabe et al. | 357/16 X |

FOREIGN PATENT DOCUMENTS 0205284 12/1983 German Democratic Rep. .

OTHER PUBLICATIONS

Craford et al., "Vapor Phase Epitaxial Materials for LED Applications", *Proceedings of the IEEE*, vol. 61, No. 7, Jul. 1973, pp. 862–880.

Primary Examiner—William Mintel
Attorney, Agent, or Firm—Spencer & Frank

[57] ABSTRACT

To improve the external quantum efficiency of light-emitting diodes made from semiconductive material of III/V compounds with lattice constants heavily dependent on the respective material composition of the mixed crystal, for example in GaAsP light-emitting diodes, a thin surface layer having an increased energy band gap in relation to the covered material is arranged on the surface layer of mixed crystal containing the p-zone and being from the same mixed-crystal system, through which layer the p-zone extends, with the transition in the lattice structure between the two surface layers being abrupt.

15 Claims, 1 Drawing Sheet

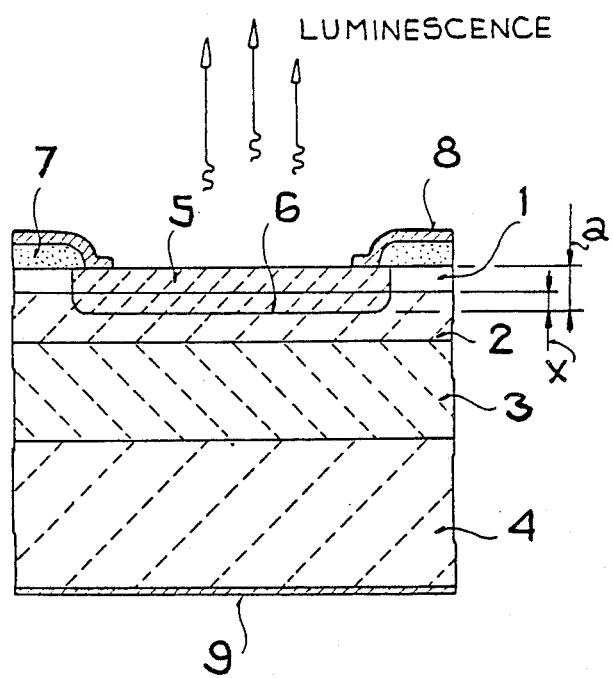
FIG.

LIGHT-EMITTING DIODE OF GaAsP COMPOUND SEMICONDUCTIVE MATERIAL

BACKGROUND OF THE INVENTION

The invention relates to a light-emitting diode of III/V compound semiconductive material having lattice constants heavily dependent on the respective material composition of the mixed crystal, in particular to a GaAsP light-emitting diode.

A light-emitting diode made from a semiconductive material of this type, for example from GaAsP or GaInP is known from the book "Optoelektronik I", Springer Verlag, 1980, pages 139-142. In particular, FIG. 5.5 on page 140 of this publication is a diagram of such a $GaAs_{0.6}P_{0.4}$ light emitting diode.

The luminescence occurrence in semiconductors made from III/V compounds is based on radiant recombination of electrons of the conduction band with holes from the valence band, with the energy released being emitted in the form of photons. This radiant recombination takes place near or within a p-n junction and supplies almost monochromatic light which is generated by transitions between two almost discrete energy levels. Beforehand, however, the semiconductor must be excited in order to increase the density of the charge carriers above their equivalent concentration. Light-emitting diodes of this type work with minority carrier injection in the case of p-n junctions polarized in the flow direction, so-called injection luminescence.

The known red-emitting $GaAs_{0.6}P_{0.4}$ light-emitting diodes have an extremely low external quantum efficiency of from approximately 0.4 to 0.6%.

In addition to causes such as non-radiant recombination processes or current flows not contributing to injection, absorption in the semiconductor interior—volume absorption—is an important reason for the low external quantum efficiency in these GaAsP light-emitting diodes. This loss mechanism prior to the emission of radiation from the light-emitting diode chip is a result of the direct energy band gap of $GaAs_{0.6}P_{0.4}$. To minimize the volume absorption losses, it is necessary in principle to reduce the paths covered by the rays prior to leaving the semiconductor crystal, i.e. the p-n junction should be as close as possible to the surface. For the GaAs diode this means that the p-layer must be kept as thin as possible. The p-n junction cannot, on the other hand, be positioned as close to the surface as wished, as otherwise non-radiant surface recombination will reduce the internal quantum efficiency and consequently also the external quantum efficiency of the light-emitting diode. The thickness of the p-layer must therefore be selected such as to achieve a compromise between volume absorption losses and non-radiant surface recombination.

From the periodical "Journal of Applied Physics", Vol. 49, September 1978, pages 4838 to 4842, particularly FIG. 6, it is known that the volume absorption losses and the losses from surface recombination are minimized when the diffusion depth of the p-n junction is 2.7 times the diffusion length of the minority carriers. Both greater and smaller diffusion depths lead to higher overall losses due to volume absorption and losses from surface recombination respectively.

SUMMARY OF THE INVENTION

The object underlying the invention is therefore to improve the external quantum efficiency by reducing the losses caused by surface recombination.

The object is attained in accordance with the invention in a light-emitting diode of the type mentioned at the outset by arranging on the mixed-crystal layer containing the p-type region a thin surface layer of the same mixed crystal, with the material composition of the surface layer being selected such that the band gap of the layer in relation to that of the covered material is increased and the p-zone extends through this surface layer.

Since this high-quality surface layer in accordance with the invention prevents the charge carriers coming to the surface and recombining there, the diffusion depth of the p-n junction can be reduced and the external quantum efficiency increased by means of a reduction of the volume absorption losses.

An advantageous embodiment of the light-emitting diode in accordance with the invention is characterized in that the thin surface layer is applied so thin by means of an abrupt change in the crystal composition that the covering layer grows in a monocrystalline manner and substantially no misfit dislocations are generated. The fact that this succeeds is surprising, since the prior art calls for layers with differing lattice constants to be adapted to one another using gradient layers, so generating a controlled network of misfit dislocations.

Particularly favorable results were achieved with light-emitting diodes whose substrate material consists of gallium arsenide (GaAs) and whose active layer consists of gallium arsenide phosphide ($GaAs_{1-x_o}P_{x_o}$), with sulphur and zinc being the preferred dopants. As mentioned above, according to the prior art a gradient layer of $GaAs_{1-x}P_x$ with $x=0$ up to a constant value of $x_o$ is arranged between the substrate material and the active layer. In accordance with a further embodiment of the invention a surface layer $GaAs_{1-(x_o+\Delta x)}P_{(x_o+\Delta x)}$ is arranged on the active layer (layer 2 in the figure), with $\Delta x$ being between 0.04 and 0.2 and the thickness of this surface layer preferably being between 5 and 500 nm. The value 0.08 for $\Delta x$ and 100 nm±50 nm for the thickness of the surface layer proved to be particularly favorable. It is clear here that an optimum diffusion depth of 1 to 1.5 times the diffusion lengths of the injected minority carriers is sufficient, whereas the value is approximately three diffusion lengths according to the prior art.

The GaAs light-emitting diode provided with a surface layer of this type according to the invention has a 60% higher photoluminescence efficiency than such GaAs light-emitting diodes without the surface layer, while the external quantum efficiency increases by 30-50%.

BRIEF DESCRIPTION OF THE DRAWINGS

An embodiment of the light-emitting diode according to the invention will now be described with reference to the drawing figure.

The figure shows a diagram section through a GaAsP light-emitting diode according to the invention.

The layer order shown in the figure is not to scale for the sake of clarity.

DESCRIPTION OF THE PREFERRED EMBODIMENTS

The light-emitting diode according to the figure comprises a substrate material 4 of monocrystalline gallium arsenide (GaAs) with n-conductivity and a thickness of 200 to 300 μm. The adjoining layer 3 serves as the gradient layer to adjust the lattice constants of the semiconductor 4 and the n-conductive layer 2, which comprises the mixed crystal $GaAs_{0.6}P_{0.4}$ and is approximately 20 μm thick. The gradient layer 3 with a thickness of approximately 30 μm is also n-conductive and comprises the mixed crystal $GaAs_{1-x}P_x$ with x=0 to x=0.4. The insufficiently large lattice constant of the substrate material 4 is thereby adjusted to the lattice constant of the semiconductor layer 2 by the generation of misfit dislocations. The layer 1, directly adjoining layer 2, represents the surface layer of mixed crystal $GaAs_{0.52}P_{0.48}$ and of approximately 100 nm thickness in accordance with the invention, with this surface layer being made epitaxially in the same way as the layers 2 and 3 underneath it. It is therefore possible to integrate the manufacture of the surface layer according to the invention of a GaAsP light-emitting diode without difficulty into the process sequence.

The GaAsP light-emitting diode according to the invention and illustrated in the figure is made in a gas-phase epitaxy reactor using the Tietjen-Rührwein method, with $H_2S$ being used as the dopant gas. The method known in the prior art concludes with the deposition of the $GaAs_{0.6}P_{0.4}$ layer 2. The abrupt transition to the surface layer 1 according to the invention is brought about by an interruption in growth achieved by stopping the HCl gas flow. The ratio of $AsH_3/PH_3$ is then reduced by about a sixth. After stabilization of the new ratio and a complete exchange of the $AsH_3/PH_3$ gas in the reactor volume, typically after 5 minutes, the HCl flow is switched on again and growth resumes. After a few minutes of growth of the surface layer the process ends. The reaction gases are shut off and the temperature is reduced. The surface of the epitaxy-generated wafer has absolutely no flaws (misfit dislocations) as a result of the formation of the surface layer 1.

The p-conductive zone 5 is made by diffusion with zinc and extends through the surface layer 1 according to the invention into the $GaAs_{0.6}P_{0.4}$ layer 2 to form the p-n junction 6, with the thickness x of the p-layer in the layer 2 being approximately 1.2 μm and the total thickness of the p-layer approximately 1.3 μm. A metal contact 8, for example of Al, is deposited on the $Si_3N_4$ passivation layer 7, and a contact 9, for example of AuGe, is arranged on the rear of the light-emitting diode.

The gallium arsenide substrate of the light-emitting diode shown in the figure can also be replaced by gallium phosphide. In addition, the surface layer in accordance with the invention can also be arranged on GaInP light-emitting diodes whose substrate material is indium phosphide. A further application of the invention is also possible for mixed crystals of GaInAsP.

What claimed is:

1. A light emitting diode, comprising:
   a semiconductor substrate;
   a GaAsP compound crystal system on said substrate, including:
   a first n-doped GaAsP surface layer having a first energy bandgap, on said substrate, and
   a second n-doped GaAsP surface layer having a second energy bandgap, directly on said first surface layer; and
   a p-type region extending through said second surface layer into said first surface layer, said second energy bandgap being greater than said first energy bandgap.

2. A light-emitting diode according to claim 1, wherein said first surface layer is of $GaAs_{1-x_o}P_{x_o}$ with constant $x_o$ over the entire thickness of said first surface layer.

3. A light-emitting diode according to claim 2, wherein the second surface layer comprises $GaAs_{1-(x_o+\Delta x)}P_{(x_o+\Delta x)}$, with $\Delta x$ being between 0.04 and 0.2.

4. A light-emitting diode according to claim 3, wherein $\Delta x$ is equal to 0.08.

5. A light-emitting diode according to claim 3, wherein the thickness of the second surface layer is between 5 nm and 500 nm.

6. A light emitting diode according to claim 5, wherein the thickness of the second surface layer is 100 nm±50 nm.

7. A light-emitting diode according to claim 3, further comprising an n-conductive gradient layer of $GaAs_{1-x}P_x$ (x=0 to $x_o$) on said substrate, said substrate comprising an n-conductive substrate material of GaAs, said first surface layer being formed on said gradient layer.

8. A light-emitting diode according to claim 3, further comprising an n-conductive gradient layer of $GaAs_{1-x}P_x$ (x=1 to $x_o$) on said substrate, said substrate comprising an n-conductive substrate material of GaP, said first surface layer being formed on said gradient layer.

9. A light emitting diode as in claim 1, wherein said second surface layer is substantially thinner than said first surface layer, said second surface layer and said first surface layer defining an interface therebetween, said first and second surface layers having an abrupt transition in lattice structure at said interface.

10. A light emitting diode as in claim 9, wherein said second surface layer is sufficiently thin as to form a monocrystaline structure having no substantial misfit dislocation.

11. A light emitting diode as in claim 10, wherein said second surface layer comprises $GaAs_{1-(x_o+\Delta x)}P_{(x_o+\Delta x)}$ and said first surface layer comprises $GaAs_{1-x_o}P_{x_o}$, where $\Delta x$ is between 0.04 and 0.2, and $x_o$ is a constant over the respective thicknesses of the first and second surface layers.

12. A light emitting diode as in claim 1, wherein said second surface layer is sufficiently thin as to form a monocrystaline structure having no substantial misfit dislocation.

13. A light emitting diode as in claim 1, wherein the thickness of the second surface layer is between 5 nm and 500 nm.

14. A light emitting diode as in claim 13, wherein said second surface layer is substantially thinner than said first surface layer.

15. A light emitting diode as in claim 1, wherein said second surface layer is substantially thinner than said first surface layer.

* * * * *